United States Patent
Kadoshima et al.

(10) Patent No.: US 12,431,336 B2
(45) Date of Patent: Sep. 30, 2025

(54) METHOD OF PROCESSING SUBSTRATE, METHOD OF MANUFACTURING SEMICONDUCTOR DEVICE, RECORDING MEDIUM, AND SUBSTRATE PROCESSING APPARATUS

(71) Applicant: Kokusai Electric Corporation, Tokyo (JP)

(72) Inventors: Masaru Kadoshima, Toyama (JP); Atsushi Sano, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 276 days.

(21) Appl. No.: 17/957,290

(22) Filed: Sep. 30, 2022

(65) Prior Publication Data
US 2023/0317420 A1  Oct. 5, 2023

(30) Foreign Application Priority Data
Mar. 29, 2022  (WO) .................. PCT/JP2022/015578

(51) Int. Cl.
*H01J 37/32* (2006.01)
*G05D 21/00* (2006.01)
*H01L 21/3065* (2006.01)
*H01L 21/311* (2006.01)
*H01L 21/3213* (2006.01)

(52) U.S. Cl.
CPC ........ *H01J 37/32449* (2013.01); *G05D 21/00* (2013.01); *H01J 37/32834* (2013.01); *H01L 21/3065* (2013.01); *H01L 21/31116* (2013.01); *H01L 21/32135* (2013.01)

(58) Field of Classification Search
CPC .......... H01J 37/32449; H01J 37/32834; G05D 21/00; H01L 21/3065; H01L 21/31116; H01L 21/32135; H01L 21/32136; H01L 21/67069; H01L 21/67115
USPC .................................................. 437/706–734
See application file for complete search history.

(56) References Cited

U.S. PATENT DOCUMENTS

| 9,870,964 B1 | 1/2018 | Yoshino et al. |
| 10,714,354 B2 | 7/2020 | Kamp et al. |
| 2006/0185592 A1 | 8/2006 | Matsuura |

(Continued)

FOREIGN PATENT DOCUMENTS

| JP | S59-143073 A | 8/1984 |
| JP | H09-148306 A | 6/1997 |

(Continued)

OTHER PUBLICATIONS

Korean Office Action issued on Jul. 10, 2024 for Korean Patent Application No. 10-2022-0120728.

(Continued)

*Primary Examiner* — Duy Vu N Deo
(74) *Attorney, Agent, or Firm* — Volpe Koenig

(57) ABSTRACT

There is provided a technique that includes: a) supplying a first gas to the substrate on which a film is formed and forming a modified layer on a surface of the film; b) after a), supplying a second gas to the modified layer and removing the modified layer; c) after b), supplying an inert gas having a first temperature higher than a processing temperature of b) to the film; and d) removing a portion of the film by performing a), b), and c) sequentially a predetermined number of times.

18 Claims, 6 Drawing Sheets

(56) References Cited

U.S. PATENT DOCUMENTS

| | | | |
|---|---|---|---|
| 2015/0184288 A1 | 7/2015 | Sasaki et al. | |
| 2015/0262834 A1 | 9/2015 | Belostotskiy et al. | |
| 2015/0262869 A1* | 9/2015 | Naik | H01L 21/32139 |
| | | | 438/643 |
| 2016/0079073 A1 | 3/2016 | Matsui et al. | |
| 2016/0196969 A1* | 7/2016 | Berry, III | H01L 21/02252 |
| | | | 438/694 |
| 2016/0293432 A1 | 10/2016 | Ranjan et al. | |
| 2019/0108982 A1 | 4/2019 | Yang et al. | |
| 2019/0279877 A1 | 9/2019 | Murakami et al. | |
| 2020/0006079 A1 | 1/2020 | Miyoshi et al. | |
| 2021/0151326 A1 | 5/2021 | Shimizu et al. | |
| 2021/0351040 A1 | 11/2021 | Mitsunari et al. | |
| 2022/0005740 A1 | 1/2022 | Paeng et al. | |
| 2022/0020598 A1* | 1/2022 | Nakatani | H01L 21/67103 |

FOREIGN PATENT DOCUMENTS

| | | |
|---|---|---|
| JP | H09-232290 A | 9/1997 |
| JP | 3266567 B | 3/2002 |
| JP | 4475136 B2 | 6/2010 |
| JP | 2015-124422 A | 7/2015 |
| JP | 2016-058590 A | 4/2016 |
| JP | 2016-072465 A | 5/2016 |
| JP | 6270952 B1 | 1/2018 |
| JP | 2019-012759 A | 1/2019 |
| JP | 6532066 B2 | 6/2019 |
| JP | 2019-160962 A | 9/2019 |
| JP | 2020-502811 A | 1/2020 |
| JP | 2020-053615 A | 4/2020 |
| JP | 2020-536393 A | 12/2020 |
| KR | 10-2016-0030822 A | 3/2016 |
| KR | 10-2020-0001962 A | 1/2020 |
| KR | 10-2020-0019983 A | 2/2020 |
| KR | 10-2020-0053623 A | 5/2020 |
| TW | 1645469 B | 12/2018 |
| TW | 202038308 A | 10/2020 |
| WO | 2018118655 A1 | 6/2018 |
| WO | 2019/070737 A1 | 4/2019 |

OTHER PUBLICATIONS

International Search Report and Written Opinion issued on Jun. 21, 2022 for PCT Patent Application No. PCT/JP2022/015578.

Taiwan Office Action issued on May 8, 2023 for Taiwan Patent Application No. 111123995.

* cited by examiner

METHOD OF PROCESSING SUBSTRATE, METHOD OF MANUFACTURING SEMICONDUCTOR DEVICE, RECORDING MEDIUM, AND SUBSTRATE PROCESSING APPARATUS

CROSS-REFERENCE TO RELATED APPLICATION

This application is based upon and claims the benefit of priority from PCT International Application No. PCT/JP2022/015578, filed on Mar. 29, 2022, the entire contents of which are incorporated herein by reference.

TECHNICAL FIELD

The present disclosure relates to a method of processing a substrate, a method of manufacturing a semiconductor device, a recording medium, and a substrate processing apparatus.

BACKGROUND

In the related art, as a process of manufacturing a semiconductor device, a process of etching a film exposed on a surface of a substrate may be performed.

With the scaling of semiconductor devices, the processing dimensions are becoming finer and more complex, and along with this, it becomes necessary to repeat a highly accurate patterning process including the above-mentioned etching process many times, which becomes a reason for an increase in cost. On the other hand, there is a technique for performing the above-mentioned etching process at an atomic layer level (hereinafter also referred to as an atomic layer etching), and such a process with high controllability is attracting attention as a useful technique for reducing the number of steps. Conventionally, the technique related to the atomic layer etching has mainly been a method using plasma.

In the conventional etching process, there is a problem that foreign matters such as particles are generated during the process, which deteriorates the quality of a film formed on a substrate.

SUMMARY

Some embodiments of the present disclosure provide a technique for suppressing deterioration in the quality of a film by reducing the amount of foreign matters generated in an etching process.

According to one embodiment of the present disclosure, there is provided a technique that includes: a) supplying a first gas to the substrate on which a film is formed and forming a modified layer on a surface of the film; b) after a), supplying a second gas to the modified layer and removing the modified layer; c) after b), supplying an inert gas having a first temperature higher than a processing temperature of b) to the film; and d) removing a portion of the film by performing a), b), and c) sequentially a predetermined number of times.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One Embodiment of the Present Disclosure

One embodiment of the present disclosure will now be described mainly with reference to FIGS. 1, 2, 3, 4 and 5A to 5G. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) Configuration of Substrate Processing Apparatus

A substrate processing apparatus 100 according to the present embodiment will be described. The substrate processing apparatus 100 is configured as, for example, a single-wafer type substrate processing apparatus as shown in FIG. 1.

Figure 1:
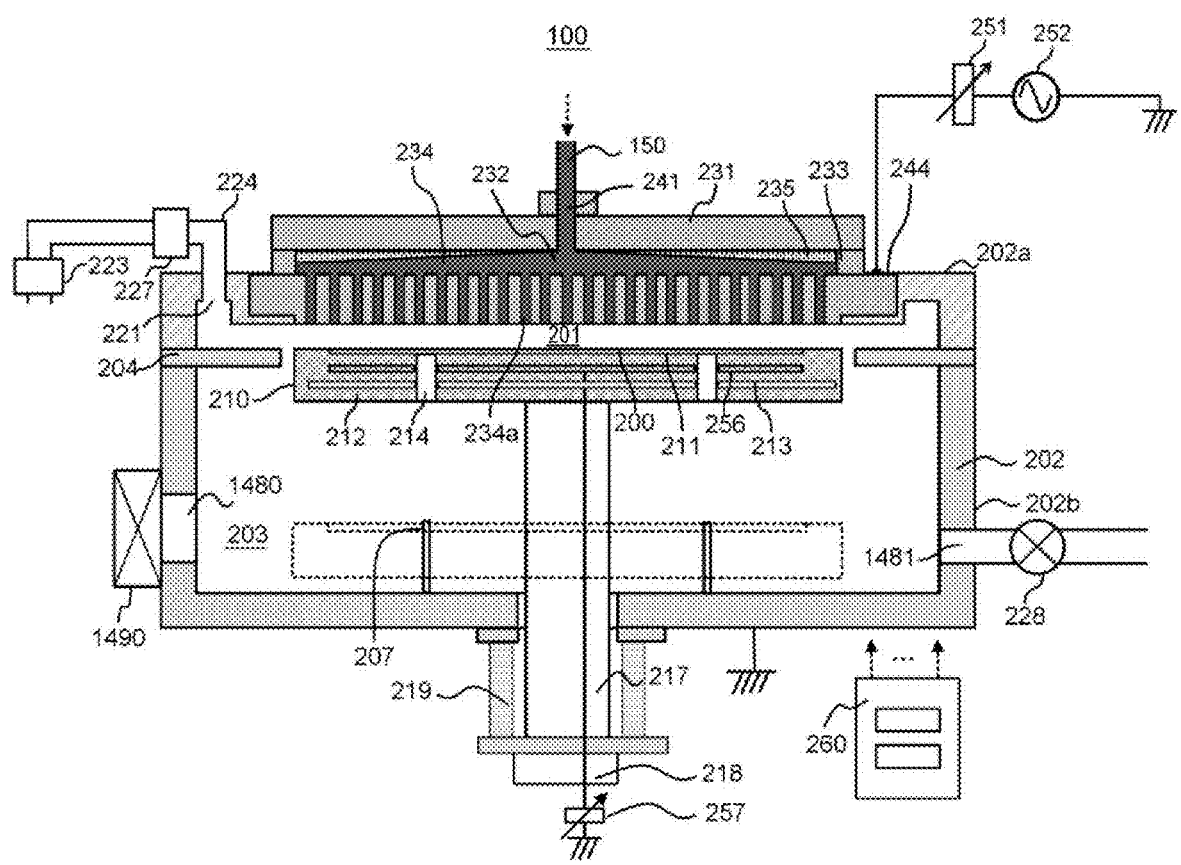
FIG. 1 is a schematic configuration view of a substrate processing apparatus according to an embodiment of the present disclosure.

As shown in FIG. 1, the substrate processing apparatus 100 includes a process container 202. The process container 202 is configured as, for example, a flat closed container having a circular horizontal cross-section. The process container 202 is made of, for example, a metal material such as aluminum (Al) or stainless steel (SUS), or quartz. A process space (process chamber) 201 for processing a wafer 200 such as a silicon wafer, as a substrate, and a transfer space (transfer chamber) 203 are formed in the process container 202. The process container 202 is composed of an upper container 202a and a lower container 202b. A partition plate 204 is installed between the upper container 202a and the lower container 202b. A space surrounded by the upper container 202a and above the partition plate 204 is called the process chamber 201, and a space surrounded by the lower container 202b and below the partition plate is called the transfer chamber 203.

A substrate loading/unloading port 1480 adjacent to a gate valve 1490 is installed on a side surface of the lower container 202b, and the wafer 200 is transferred to or from a transfer chamber (not shown) via the substrate loading/unloading port 1480. A plurality of lift pins 207 are installed at a bottom of the lower container 202b. Furthermore, the lower container 202b is grounded.

A substrate support 210 that supports the wafer 200 is installed in the process chamber 201. The substrate support 210 mainly includes a mounting surface 211 on which the wafer 200 is mounted, a mounting table (substrate mounting table) 212 having the mounting surface 211 on its surface, and a heater 213 as a heating part. Through-holes 214 through which the lift pins 207 penetrate are installed in the substrate mounting table 212 at positions corresponding to the lift pins 207, respectively. Further, the substrate mounting table 212 may be installed with a bias electrode 256 that applies a bias to the wafer 200 and the process chamber 201. The bias electrode 256 is connected to a bias adjuster 257 and is configured such that the bias can be adjusted by the bias adjuster 257.

The substrate mounting table 212 is supported by a shaft 217. The shaft 217 penetrates through the bottom of the process container 202 and is further connected to an elevator 218 outside the process container 202. By operating the elevator 218 to elevate the shaft 217 and the substrate mounting table 212, the wafer 200 mounted on the substrate mounting surface 211 can be elevated. Further, the periphery of a lower end portion of the shaft 217 is covered with a bellows 219 to keep an inside of the process chamber 201 airtight.

The substrate mounting table 212 lifts down to a wafer transfer position indicated by a broken line in FIG. 1 when the wafer 200 is transferred, and lifts up to a process position (wafer process position) shown in FIG. 1 when the wafer 200 is processed.

Specifically, when the substrate mounting table 212 is lifted down to the wafer transfer position, an upper end portions of the lift pins 207 protrude from an upper surface of the substrate mounting surface 211 so that the lift pins 207 support the wafer 200 from below. Further, when the substrate mounting table 212 is lifted up to the wafer process position, the lift pins 207 are buried from the upper surface of the substrate mounting surface 211 so that the substrate mounting surface 211 supports the wafer 200 from below. Since the lift pins 207 come into direct contact with the wafer 200, they may be made of a material such as quartz or alumina.

(Exhaust System)

An exhaust port 221 as a first exhaust part (first exhauster) for exhausting the atmosphere of the process chamber 201 is provided on an inner wall side surface of the process chamber 201 (the upper container 202a). An exhaust pipe 224 is connected to the exhaust port 221, and a pressure regulator 227 such as an auto pressure controller (APC) for controlling the inside of the process chamber 201 to a predetermined pressure and a vacuum pump 223 are sequentially connected in series to the exhaust pipe 224. A first exhaust system (exhaust line) mainly includes the exhaust port 221, the exhaust pipe 224, and the pressure regulator 227. The vacuum pump 223 may also be included in the first exhaust system. An exhaust pipe 1481 for exhausting the atmosphere of the transfer chamber 203 is installed on an inner wall side surface of the transfer chamber 203. A pressure regulator 228 is installed in the exhaust pipe 1481 so that a pressure inside the transfer chamber 203 is configured to be capable of being exhausted to a predetermined pressure. Further, an atmosphere inside the process chamber 201 can be also exhausted through the transfer chamber 203.

(Gas Introduction Port)

A gas introduction port 241 for supplying various gases into the process chamber 201 is installed on an upper surface (ceiling wall) of a shower head 234 installed in an upper portion of the process chamber 201. The configuration of each gas supply unit connected so as to communicate with the gas introduction port 241, which is a gas supplier, will be described later.

(Gas Dispersion Unit)

The shower head 234 as a gas dispersion unit includes a buffer chamber 232 and an electrode 244 as an activator. The electrode 244 is installed with a plurality of holes 234a for dispersing and supplying a gas to the wafer 200. The shower head 234 is installed between gas introduction port 241 and the process chamber 201. A gas introduced from the gas introduction port 241 is supplied into the buffer chamber 232 (dispersion part) of the shower head 234 and is then supplied into the process chamber 201 via the holes 234a.

The electrode 244 is made of a conductive metal and is configured as a portion of the activator (excitation part) for exciting a gas. A matcher (matching device) 251 and a high frequency power source 252 are connected to the electrode 244 so that electromagnetic waves (high frequency power or microwaves) can be supplied. When a lid 231 is made of a conductive material, an insulating block 233 is installed between the lid 231 and the electrode 244 to insulate the lid 231 and the electrode 244 from each other. Further, the electrode 244 is configured to be supported by the upper container 202a. The excitation part is composed of at least the electrode 244, the matcher 251, and the high frequency power source 252.

A gas guide 235 may be installed in the buffer chamber 232. The gas guide 235 has a conical shape whose diameter increases in the radial direction of the wafer 200 with the gas introduction hole 241 as a center. The horizontal diameter of a lower end of the gas guide 235 is formed to extend to the outer circumference beyond the end portion of a region where the holes 234a are installed. Since the gas guide 235 is installed, the gas can be uniformly supplied to each of the plurality of holes 234a, so that the amount of active species supplied within the surface of the wafer 200 can be made uniform.

(Gas Supply System)

A gas supply pipe 150 is connected to the gas introduction hole 241. A first gas, a second gas, and an inert gas, which will be described later, are supplied from the gas supply pipe 150.

Figure 2:
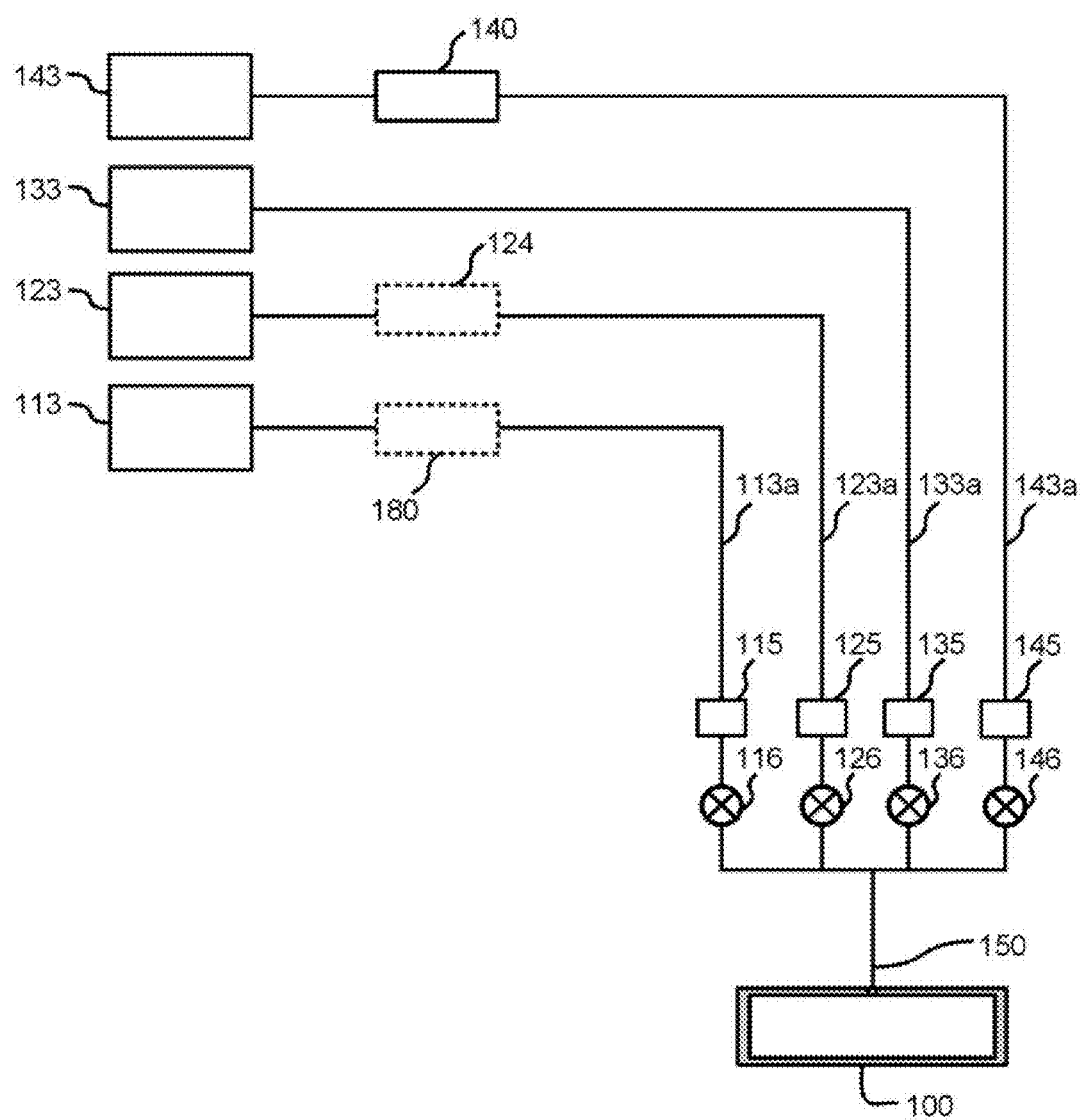
FIG. 2 is a schematic configuration diagram of a gas supply system according to an embodiment of the present disclosure.

FIG. 2 shows a schematic configuration diagram of a first gas supplier, a second gas supplier, an inert gas supplier, and a third gas supplier.

As shown in FIG. 2, a first gas supply pipe 113a, a second gas supply pipe 123a, an inert gas supply pipe 133a, and a third gas supply pipe 143a are connected to the gas supply pipe 150.

(First Gas Supplier)

The first gas supplier includes the first gas supply pipe 113a and is installed with a mass flow controller (MFC) 115 and a valve 116 sequentially from the upstream. The first gas supplier may include a first gas supply source 113 connected to the first gas supply pipe 113a. Further, when the precursor of a process gas is liquid or solid, a vaporizer 180 may be installed.

(Second Gas Supplier)

The second gas supplier includes the second gas supply pipe 123a and is installed with an MFC 125 and a valve 126 sequentially from the upstream. The second gas supplier may include a second gas supply source 123 connected to the second gas supply pipe 123a. Further, a Remote Plasma Unit (RPU) 124 may be installed to activate the second gas.

(First Inert Gas Supplier)

The first inert gas supply pipe 133a, an MFC 135, and a valve 136 are installed in the first inert gas supplier. A first inert gas supply source 133 connected to the first inert gas supply pipe 133a may be included in the first inert gas supplier.

(Second Inert Gas Supplier)

The second inert gas supplier includes the second inert gas supply pipe 143a and is installed with a gas heater 140, an MFC 145, and a valve 146 sequentially from the upstream. The second inert gas supplier may include a second inert gas supply source 143 connected to the second inert gas supply pipe 143a.

In the present embodiment, at least one of the first gas supplier, the second gas supplier, the first inert gas supplier, and the second inert gas supplier, or a combination thereof, is called a gas supplier.

(Controller)

As shown in FIG. 1, the substrate processing apparatus 100 includes a controller (control part 260) capable of controlling the operation of each part of the substrate processing apparatus 100.

Figure 3:
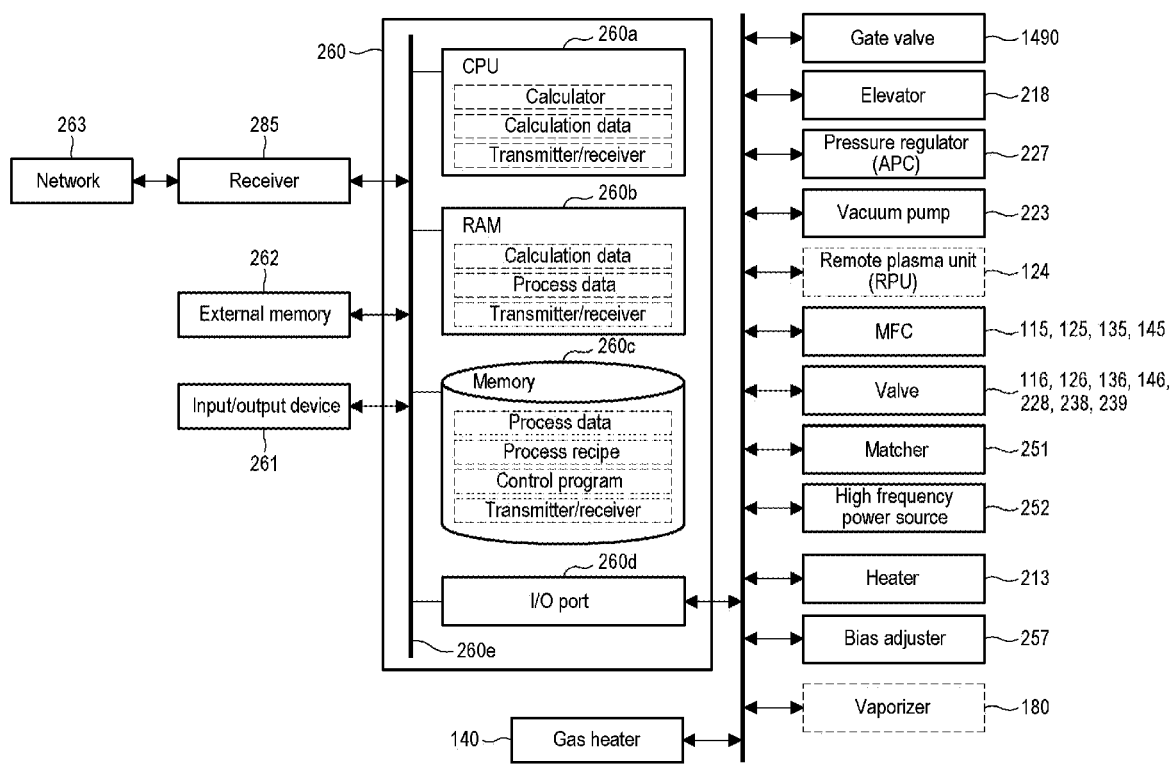
FIG. 3 is a schematic configuration diagram of a controller of the substrate processing apparatus according to an embodiment of the present disclosure.

The controller 260 is schematically shown in FIG. 3. The controller 260, which is a control part (control means), is configured as a computer having a Central Processing Unit (CPU) 260a, a Random Access Memory (RAM) 260b, a memory 260c, and an I/O port 260d. The RAM 260b, the memory 260c, and the I/O port 260d are configured to be capable of exchanging data with the CPU 260a via an internal bus 260e. An input/output device 261 formed of, e.g., a touch panel or the like, an external memory 262, a receiver 285, and the like are connected to the controller 260.

The memory 260c is configured by, for example, a flash memory, a Hard Disk Drive (HDD), or the like. A control program for controlling operations of a substrate processing apparatus, a process recipe in which sequences and conditions of substrate processing to be described later, are written, and calculation data, process data, and the like generated in a process of setting the process recipe used for processing the wafer 200, are readably stored in the memory 260c. The process recipe functions as a program for causing the controller 260 to execute each sequence in the substrate processing, which will be described later, to obtain an expected result. Hereinafter, the program recipe, the control program, and the like may be generally and simply referred to as a "program." When the term "program" is used herein, it may indicate a case of including the program recipe only, a case of including the control program only, or a case of including both the program recipe and the control program. The RAM 260b is configured as a memory area (work area) in which programs or data such as calculation data and process data read by the CPU 260a are temporarily stored.

The I/O port 260d is connected to the gate valve 1490, the elevator 218, the heater 213, the pressure regulator 227, the vacuum pump 223, the matcher 251, the high frequency power source 252, the MFCs 115, 125, 135, and 145, the valves 116, 126, 136, 228, 238, and 239, the RPU 124, the vaporizer 180, the bias adjuster 257, the gas heater 140, and the like.

The CPU 260a as a calculator (calculation part) is configured to read and execute the control program from the memory 260c. The CPU 260a is also configured to read the process recipe from the memory 260c according to an input of an operation command from the input/output device 261. In addition, the CPU 260a is configured to be capable of calculating the calculation data by comparing and calculating a set value input from the receiver 285 and the process recipe and control data stored in the memory 260c. Further, the CPU 260a is configured to be capable of executing a decision process of the corresponding process data (the process recipe) from the calculation data. Then, the CPU 260a is configured to be capable of controlling the opening or closing operation of the gate valve 1490, the raising or lowering operation of the elevator 218, the power supplying operation to the heater 213, the pressure adjusting operation of the pressure regulator 227, the on/off control of the vacuum pump 223, the gas flow rate controlling operation in the MFCs 115, 125, 135, and 145, the gas activating operation of the RPU 124, the gas on/off control in the valves 116, 126, 136, 228, 238, and 239, the power matching operation of the matcher 251, the power controlling of the high frequency power source 252, the controlling operation of the bias adjuster 257, the controlling operation of the gas heater 140, and so on, according to contents of the read process recipe.

In addition, the controller 260 is not limited to being configured as a dedicated computer, but may be configured as a general-purpose computer. For example, the controller 260 according to the present embodiment can be configured by preparing an external memory (for example, a magnetic tape, a magnetic disk such as a flexible disk or a hard disk, an optical disk such as a CD or a DVD, a magneto-optical disc such as an MO, or a semiconductor memory such as a USB memory or a memory card) 262 that stores the above-mentioned program and installing the program in the general-purpose computer by using the external memory 262. A means for supplying the program to the computer is not limited to a case of supplying the program via the external memory 262. For example, the program may be supplied by using a communication means such as the receiver 285 or a network 263 (the Internet or a dedicated line) without using the external memory 262. The memory 260c and the external memory 262 are configured as a non-transitory computer-readable recording medium. Hereinafter, the memory 260c and the external memory 262 may be generally and simply referred to as a "recording medium." When the term "recording medium" is used herein, it may indicate a case of including the memory 260c only, a case of including the external memory 262 only, or a case of including both the memory 260c and the external memory 262.

(2) Substrate Processing Process

As a process of manufacturing a semiconductor device using the above-described substrate processing apparatus, an example of an etching process sequence for etching a base 200a as a film exposed on the surface of the wafer 200 as a substrate, that is, a gas supply sequence example in an etching process, will be described mainly with reference to FIGS. 4 and 5A to 5G. In the following descriptions, the operations of the respective parts constituting the substrate processing apparatus are controlled by the controller 260.

Figure 4:
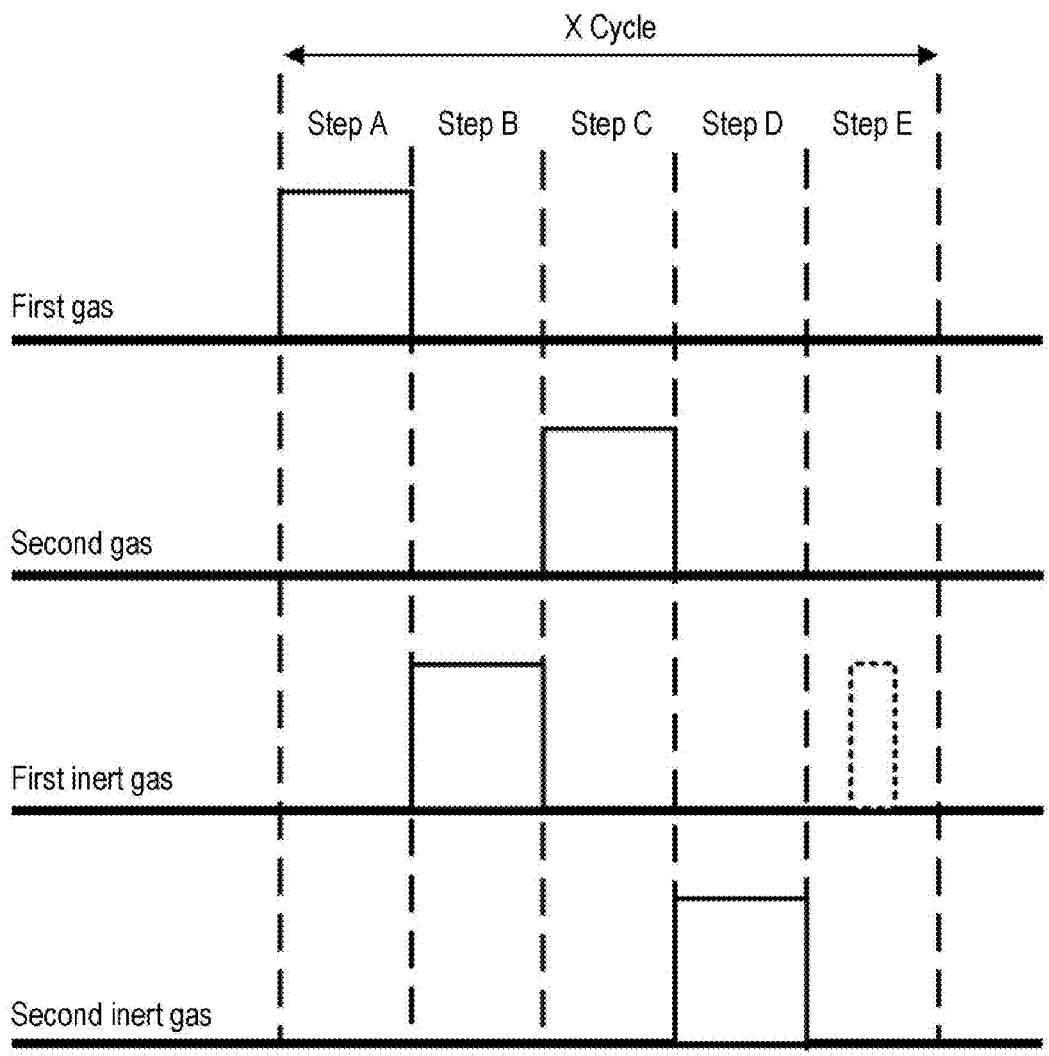
FIG. 4 is a sequence example of a substrate processing process according to an embodiment of the present disclosure.

In a gas supply sequence shown in FIG. 4, the base 200a is etched by performing a cycle a predetermined number of times (n times, where n is an integer of 1 or more), the cycle including non-simultaneously performing:

step A of supplying a first gas to the wafer 200 forming a modified layer 200b on at least a portion of the base 200a, which is a film exposed on the surface of a wafer 200;

step B of supplying a first inert gas to the wafer 200 after step A;

step C of supplying a second gas, which has a molecular structure different from that of the first gas, to the wafer 200 to generate an etching species by at least one selected from causing reaction between the second gas and the modified layer 200b and activating the modified layer 200b by the second gas, and etching at least a portion of the base 200a by the etching species; and step D of supplying a heated second inert gas to the wafer 200 after step C.

In the present disclosure, for the sake of convenience, the above-described processing sequence may be denoted as follows. The same denotation is also used in modifications and the like to be described later.

(First gas→First purge→Second gas→Second purge)×n

When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

Further, when the term "base" is used in the present disclosure, it may refer to "a wafer itself" or "a layer or film formed on a surface of a wafer." When the phrase "a surface of a base" is used in the present disclosure, it may refer to "a surface of a wafer itself" or "a surface of a certain layer formed on a surface of a wafer." When the expression "a certain layer is formed on a surface of a base" is used in the present disclosure, it may mean that "a certain layer is formed directly on a surface of a wafer itself" or that "a certain layer is formed on a surface of a layer formed on a surface of a wafer."

(Substrate Loading Step)

For processing, first, the wafer 200 is loaded into the process chamber 201. Specifically, the substrate support 210 is lowered by the elevator 218 so that the lift pins 207 protrude from the through-holes 214 toward the upper surface of the substrate support 210. After a pressure inside the process chamber 201 or the transfer chamber 203 is adjusted to a predetermined pressure, the gate valve 1490 is opened and the wafer 200 is mounted on the lift pins 207 from the gate valve 1490. After the wafer 200 is mounted on the lift pins 207, the gate valve 1490 is closed, and the substrate support 210 is raised to a predetermined position by the elevator 218, whereby the wafer 200 is mounted on the substrate support 210 from the lift pins 207.

(Pressure Regulation and Temperature Regulation)

Subsequently, the inside of the process chamber 201 is exhausted through the exhaust pipe 224 so that the inside of the process chamber 201 has a predetermined pressure (vacuum degree). At this time, the opening degree of the APC valve as the pressure regulator 227 is feedback-controlled based on a pressure value measured by a pressure sensor (not shown). Further, the degree of conducting electricity to the heater 213 is feedback-controlled based on a temperature value measured by a temperature sensor (not shown) so that the inside of the process chamber 201 has a predetermined temperature. Specifically, the substrate support 210 is heated in advance by the heater 213 and is left for a certain period of time after a change in temperature of the wafer 200 or the substrate support 210 stops. During this period, if there is moisture remaining in the process chamber 201 or degassing from members, it may be removed by vacuum-exhaust or supply of a $N_2$ gas. This completes preparations before film-forming process. In addition, when the inside of the process chamber 201 is exhausted to a predetermined pressure, the inside of the process chamber 201 may be vacuum-exhausted once to a reachable vacuum degree. Both the exhaust of the inside of the process chamber 201 and the heating of the wafer 200 are continuously performed at least until the processing on the wafers 200 is completed.

When a plurality of concave portions are formed on the surface of the wafer 200, a pressure inside the process chamber 201 may be lowered. Further, the concave portions may be formed in the wafer 200 or may be formed in the base 200a. When the concave portions are formed in the wafer 200, FIGS. 5A to 5G of the present disclosure become diagrams showing a cross-sectional view of the bottom surface or side wall within the concave portions.

(Etching Process)

After that, a cycle including non-simultaneously performing the next step A and step C is performed a predetermined number of times.

[Step A: First Gas Supply (Modifying Gas Supply)]

In step A, a first gas is supplied to the wafer 200 in the process chamber 201, that is, the wafer 200 having the base 200a as a film exposed on the surface of the wafer 200.

Specifically, the valve 116 is opened to allow the first gas to flow into the gas supply pipe 113a. The flow rate of the first gas is adjusted by the MFC 115, and the first gas is supplied into the process chamber 201, flows over the surface of the wafer 200, and is exhausted through the exhaust port 221. At this time, the first gas is supplied to the wafer 200. Further, at this time, the valve 136 may be opened to allow an inert gas to be supplied into the process chamber 201.

Figure 5A:
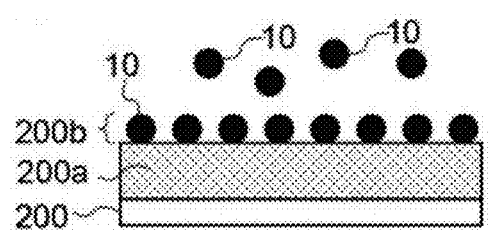
FIGS. 5A to 5G are model diagrams showing the surface state of a substrate in a substrate processing process according to an embodiment of the present disclosure.

By supplying the first gas to the wafer 200 under the conditions to be described later, it is possible to uniformly modify the surface of the base 200a. Specifically, as shown in FIG. 5A, when the first gas 10 is supplied to the wafer 200 having the base 200a exposed on the surface of the wafer 200, the first gas 10 is uniformly adsorbed in the plane of the surface of the base 200a to form a modified layer 200b.

The modified layer 200b is formed by at least one of adsorbing physically or chemically at least some of molecules of the first gas 10 on at least a portion of the surface of the base 200a (hereinafter also referred to as modification by adsorption) or generating a compound through a chemical reaction between at least some of the molecules of the first gas 10 and at least some atoms or molecules on the surface of the base 200a (hereinafter also referred to as modification by compound generation). That is, in this step, it is possible to modify the surface of the base 200a by the modification by adsorption and/or the modification by compound generation using the first gas 10. FIG. 5A shows, as an example, the modified layer 200b formed by adsorbing at least some of the molecules of the first gas 10 on at least a portion of the surface of the base 200a.

In the modification by adsorption, a modified portion (that is, a portion where the modified layer 200b is formed) of the base 200a becomes the base of etching species generated in step C to be described later. Therefore, it is possible to control the amount of etching species generated in step C by the amount of adsorption of the first gas on the surface of the base 200a. Similarly, in the modification by compound generation, the modified portion (that is, the portion where the modified layer 200b is formed) of the base 200a becomes the base of etching species generated in step C to be described later. Therefore, it is possible to control the amount of etching species generated in step C by the amount of compounds generated on the surface of the base 200a. Under the conditions to be described later, the modified layer 200b can be uniformly formed in the plane of the surface of the base 200a, which makes it possible to generate etching species in the plane of the surface of the base 200a in step C to be described.

Further, depending on the process conditions, a reaction for forming the modified layer 200b can be self-limited. In other words, depending on the process conditions, it is possible to saturate a modifying reaction by adsorption, and it is also possible to saturate a modifying reaction by compound formation. By saturating the reaction for forming the modified layer 200b, it is possible to form the modified layer 200b more uniformly in the plane of the surface of the base 200a. As a result, in step C to be described later, it is possible to generate the etching species more uniformly in the plane of the surface of the base 200a.

The process conditions for supplying the first gas in step A are exemplified as follows.
 Processing temperature: 25 to 400 degrees C., specifically 50 to 250 degrees C.
 Processing pressure: 1 to 13,300 Pa, specifically 50 to 2,660 Pa
 First gas supply flow rate: 1 to 5,000 sccm, specifically 50 to 2,000 sccm
 First gas supply time: 1 to 3,000 seconds, specifically 10 to 1,200 seconds
 Inert gas supply flow rate (for each gas supply pipe): 100 to 5,000 sccm, specifically 100 to 3,000 sccm In the present disclosure, the notation of a numerical range such as "25 to 400 degrees C." means that the lower limit value and the upper limit value are included in the range. Therefore, for example, "25 to 400 degrees C." means "25 degrees C. or higher and 400 degrees C. or lower." The same applies to other numerical ranges. Further, the processing temperature means the temperature of the wafer 200, and the processing pressure means the pressure inside the process chamber 201. This applies equally to the following description.

Under the above-mentioned process conditions, by setting the processing temperature to 25 degrees C. or higher, specifically 50 degrees C. or higher, it is possible to form the modified layer 200b at a practical formation rate. Further, under the above-mentioned process conditions, by setting the processing temperature to 400 degrees C. or lower, specifically 250 degrees C. or lower, it is possible to uniformly form the modified layer 200b in the plane of the surface of the base 200a while suppressing a film (the base 200a) from being directly etched by the first gas.

Further, in this step, the first gas can be supplied to the wafer 200 under the condition that a reaction for forming the modified layer 200b can be saturated. This makes it possible to form the modified layer 200b more uniformly in the plane of the surface of the base 200a. For example, by setting the processing temperature to a predetermined temperature of 250 degrees C. or lower, specifically 200 degrees C. or lower, more specifically 150 degrees C. or lower, it is possible to saturate the reaction for forming the modified layer 200b. Further, even when the processing temperature is set as above, the reactions for forming the modified layer 200b can also be unsaturated by adjusting the conditions (for example, shortening the first gas supply time, lowering the processing pressure, etc.) other than the processing temperature.

When the first gas exists alone (that is, when the first gas is supplied alone to the wafer 200 with the base 200a exposed. The same applies hereinafter), it can be said that the above-mentioned process conditions are the conditions that make it difficult for an etching reaction of the base 200a to proceed continuously. Further, when the second gas exists alone (that is, when the second gas is supplied alone to the wafer 200 with the base 200a exposed, the same applies hereinafter), it can also be said that the above-mentioned process conditions are the conditions that make it difficult for the etching reaction of the base 200a to proceed continuously.

The first gas used in step A is not particularly limited as long as it can modify the surface of the base 200a, which is a film.

Examples of the first gas may include a silicon (Si)-containing gas, a metal-containing gas, an oxygen (O)-containing gas, a nitrogen (N)- and hydrogen (H)-containing gas, a boron (B)-containing gas, a phosphorus (P)-containing gas, a halogen-containing gas, etc. One or more of these gases can be used as the first gas.

As the Si-containing gas given as an example of the first gas, for example, an aminosilane-based gas, which is a gas containing Si and an amino group, can be used.

Here, the amino group is a functional group in which one or two hydrocarbon groups containing one or more carbon (C) atoms are coordinated to one nitrogen (N) atom (a functional group in which one or both of Hs of an amino group represented by $NH_2$ are substituted with a hydrocarbon group containing one or more C atoms). When two hydrocarbon groups constituting a portion of the amino group are coordinated to one N, the two hydrocarbon groups may be the same hydrocarbon group or different hydrocarbon groups. The hydrocarbon group may contain a single bond like an alkyl group, or may contain an unsaturated bond such as a double bond or a triple bond. The amino group may have a cyclic structure. Since the amino group is bonded to Si, which is the center atom of an aminosilane molecule, the amino group in aminosilane can also be called a ligand or an amino ligand. The aminosilane-based gas may further contain a hydrocarbon group in addition to Si and the amino group. The hydrocarbon group may contain a single bond like an alkyl group, or may contain an unsaturated bond such as a double bond or a triple bond. The hydrocarbon group may have a cyclic structure. The hydrocarbon group may be bonded to Si, which is the center atom of the aminosilane molecule, in which case the hydrocarbon group in the aminosilane may also be referred to as a ligand or a hydrocarbon ligand. If the hydrocarbon group is an alkyl group, the hydrocarbon group can also be referred to as an alkyl ligand. Hereinafter, the alkyl group may be represented by R.

Examples of the aminosilane-based gas may include dimethylaminotrimethylsilane $((CH_3)_2NSi(CH_3)_3$, abbreviation: DMATMS) gas, diethylaminotrimethylsilane $((C_2H_5)_2NSi(CH_3)_3$, abbreviation: DEATMS) gas, diethylaminotriethylsilane $((C_2H_5)_2NSi(C_2H_5)_3$, abbreviation: DEATES), dimethylaminotriethylsilane $((CH_3)_2NSi(C_2H_5)_3$, abbreviation: DMATES) gas, and the like. Further, in addition to one amino group (dimethylamino group or diethylamino group), three alkyl groups (methyl groups or ethyl groups) are bonded to Si, which is the center atom of DMATMS, DEATMS, DEATES, DMATES, or the like.

That is, DMATMS, DEATMS, DEATES, DMATES, and the like contain one amino ligand and three alkyl ligands.

In addition to these gases, a gas of an aminosilane compound represented by the following formula [1] can be used as the aminosilane-based gas.

$$SiA_x[(NB_2)_{(4-x)}] \qquad [1]$$

In the formula [1], A represents an H atom, an alkyl group, or an alkoxy group, B represents an H atom or an alkyl group, and x represents an integer of 1 to 3. The alkyl group represented by A is specifically an alkyl group may have 1 to 5 carbon atoms, more specifically an alkyl group may have 1 to 4 carbon atoms. The alkyl group represented by A may be linear or branched. Examples of the alkyl group represented by A may include a methyl group, an ethyl group, an n-propyl group, an n-butyl group, an isopropyl group, an isobutyl group, a sec-butyl group, a tert-butyl group, etc. The alkoxy group represented by A is specifically an alkoxy group may have 1 to 5 carbon atoms, more specifically an alkoxy group may have 1 to 4 carbon atoms. The alkyl group in the alkoxy group represented by A is the same as the alkyl group represented by A. When x is 2 or 3, two or three As may be the same or different. The alkyl group represented by B is the same as the alkyl group represented by A. Two Bs may be the same or different, and when x is 1 or 2, a plurality of (NB$_2$)s may be the same or different. Furthermore, two Bs may bonded to form a cyclic structure, and the formed cyclic structure may further have a substituent such as an alkyl group.

Examples of the aminosilane-based gas represented by the formula [1] may include monoaminosilane (SiH$_3$(NR$_2$), abbreviation: MAS) gas in which A is an H atom, B is an alkyl group, and x is 3 in the formula [1] (that is, an aminosilane compound containing one amino group in one molecule), bisaminosilane (SiH$_2$(NR$_2$)$_2$, abbreviation: BAS) gas in which A is an H atom, B is an alkyl group, and x is 2 in the formula [1] (that is, an aminosilane compound containing two amino groups in one molecule), and trisaminosilane (SiH(NR$_2$)$_3$, abbreviation: TAS) gas in which A is an H atom, B is an alkyl group, and x is 1 in the formula [1] (that is, an aminosilane compound containing three amino groups in one molecule). Among them, the MAS gas may use as the aminosilane-based gas. By using the MAS gas as the first gas, in step A, it is possible to more uniformly and sufficiently modify the surface of the base 200a.

Examples of the MAS gas may include ethylmethylaminosilane (SiH$_3$[N(CH$_3$)(C$_2$H$_5$)]) gas, a dimethylaminosilane (SiH$_3$[N(CH$_3$)$_2$]) gas, diisopropylaminosilane (SiH$_3$[N(C$_3$H$_7$)$_2$]) gas, a di secondarybutylaminosilane (SiH$_3$[H(C$_4$H$_9$)$_2$]) gas, dimethylpiperidinosilane (SiH$_3$[NC$_5$H$_8$(CH$_3$)$_2$]) gas, diethylpiperidinosilane (SiH$_3$[NC$_5$H$_8$(C$_2$H$_5$)$_2$]) gas, etc. One or more of these gases can be used as the MAS gas. In the present disclosure, the MAS gas may be a gas of an aminosilane compound having one amino group in one molecule, and also may include a structure other than the structure represented by SiH$_3$(NR$_2$). For example, since the aforementioned DMATMS, DEATMS, DEATES, and DMATES are also aminosilane compounds containing one amino group in one molecule, these can also be included in the MAS gas. Further, the aforementioned DMATMS, DEATMS, DEATES, and DMATES are aminosilane compounds in which A is an alkyl group, B is an alkyl group, and x is 3 in the formula [1].

An example of the Si-containing gas given as an example of the first gas may include a halosilane-based gas which is a gas containing Si and a halogeno group. The halogeno group may contain at least one of a fluoro group, a chloro group, a bromo group, and an iodo group, and specifically may contain the chloro group. That is, the halosilane-based gas may contain at least one of fluorine (F), chlorine (Cl), bromine (Br), and iodine (I), and specifically may contain Cl. Examples of the halosilane-based gas may include a chlorosilane-based gas such as hexachlorodisilane (Si$_2$Cl$_6$) gas, tetrachlorosilane (SiCl$_4$) gas, trichlorosilane (SiHCl$_3$) gas, dichlorosilane (SiH$_2$Cl$_2$) gas, or monochlorosilane (SiH$_3$Cl) gas, a fluorosilane-based gas such as tetrafluorosilane (SiF$_4$) gas or difluorosilane (SiH$_2$F$_2$) gas, a bromosilane-based gas such as tetrabromosilane (SiBr$_4$) gas or dibromosilane (SiH$_2$Br$_2$) gas, an iodosilane-based gas such as tetraiodosilane (SiI$_4$) gas or diiodosilane (SiH$_2$I$_2$) gas, etc. One or more of these gases can be used as the halosilane-based gas.

An alkylhalosilane-based gas can also be used as the halosilane-based gas. Examples of the alkylhalosilane-based gas may include an alkylchlorosilane-based gas such as dimethyldichlorosilane ((CH$_3$)$_2$SiCl$_2$) gas or trimethylchlorosilane ((CH$_3$)$_3$SiCl) gas, an alkylfluorosilane-based gas such as dimethyldifluorosilane ((CH$_3$)$_2$SiF$_2$) gas or trimethylfluorosilane-based gas ((CH$_3$)$_3$SiF) gas, an alkylbromosilane-based gas such as dimethyldibromosilane ((CH$_3$)$_2$SiBr$_2$) gas or trimethylbromosilane ((CH$_3$)$_3$SiBr) gas, an alkyliodosilane-based gas such as dimethyldiiodosilane ((CH$_3$)$_2$SiI$_2$) gas or trimethyliodosilane ((CH$_3$)$_3$SiI) gas, etc. One or more of these gases can be used as the alkylhalosilane-based gas.

An example of the Si-containing gas given as an example of the first gas may include a gas containing Si and H, that is, a silicon hydride gas. Examples of the silicon hydride gas may include monosilane (SiH$_4$) gas, disilane (Si$_2$H$_6$) gas, trisilane (Si$_3$H$_8$) gas, tetrasilane (Si$_4$H$_{10}$) gas, etc. One or more of these gases can be used as the silicon hydride gas.

Examples of the metal-containing gas given as an example of the first gas may include a gas containing metal and an amino group, a gas containing metal and a halogeno group, etc. The halogeno group preferably contains at least one of a fluoro group, a chloro group, a bromo group, and an iodo group, and more preferably contains the chloro group. That is, the gas containing metal and the halogeno group may contain at least one of F, Cl, Br, and I, and specifically may contain Cl. Examples of these gases may include tetrakis(dimethylamino)titanium (Ti[N(CH$_3$)$_2$]$_4$) gas, tetrakis(diethylamino)titanium (Ti[N(C$_2$H$_5$)$_2$]$_4$) gas, tetrafluorotitanium (TiF$_4$) gas, tetrachlorotitanium (TiCl$_4$) gas, tetrabromotitanium (TiBr$_4$) gas, tetraiodotitanium (TiI$_4$) gas, etc. One or more of these gases can be used as these gases.

Examples of the O-containing gas given as an example of the first gas may include oxygen (O$_2$) gas, nitric oxide (NO) gas, nitrogen dioxide (NO$_2$) gas, nitrous oxide (N$_2$O) gas, ozone (O$_3$) gas, water vapor (H$_2$O gas), hydrogen peroxide (H$_2$O$_2$) gas, O$_2$ gas+H$_2$ gas, O$_3$ gas)+H$_2$ gas, etc. One or more of these gases can be used as the O-containing gas.

Examples of the N- and H-containing gas given as an example of the first gas may include ammonia (NH$_3$) gas, hydrazine (N$_2$H$_4$) gas, diazene (N$_2$H$_2$) gas, monomethylhydrazine (CH$_3$HN$_2$H$_2$) gas, dimethylhydrazine ((CH$_3$)$_2$N$_2$(CH$_3$)H) gas, trimethylhydrazine ((CH$_3$)$_3$N$_2$H$_2$) gas, etc. One or more of these gases can be used as the N- and H-containing gas.

Examples of the B-containing gas and the P-containing gas, which are given as examples of the first gas, may include a B- and H-containing gas, a P- and H-containing gas, etc. These gases may include diborane (B$_2$H$_6$) gas, phosphine (PH$_3$) gas, etc. One or more of these gases can be used as the B-containing gas and the P-containing gas.

Examples of the halogen-containing gas given as an example of the first gas may include a C- and F-containing gas, a Cl- and F-containing gas, an F-containing gas, an N- and F-containing gas, an N-, F- and O-containing gas, an N-, Cl- and O-containing gas, etc. Examples of these gases may include tetrafluoromethane ($CF_4$) gas, hexafluoroethane ($C_2F_6$) gas, octafluoropropane ($C_3F_8$) gas, chlorine monofluoride (ClF) gas, chlorine trifluoride ($ClF_3$) gas, fluorine ($F_2$) gas, nitrogen trifluoride ($NF_3$) gas, nitrosyl fluoride (FNO) gas, nitrosyl trifluoride ($F_3NO$) gas, nitroyl fluoride ($FNO_2$) gas, nitrosyl chloride (ClNO) gas, $NF_3$ gas+NO gas, $F_2$ gas+NO gas, ClF gas+NO gas, $ClF_3$ gas+NO gas, etc. One or more of these gases can be used as the halogen-containing gas.

In the present disclosure, the description of two gases such as "$NF_3$ gas+NO gas" together means a mixed gas of $NF_3$ gas and NO gas. When supplying the mixed gas, the two gases may be mixed (pre-mixed) in a supply pipe and then supplied into the process chamber 201, or the two gases may be supplied separately from different supply pipes into the process chamber 201 and then mixed (post-mixed) in the process chamber 201.

Further, such as an FNO gas which is difficult to store, may be generated, for example, by mixing $F_2$ gas and NO gas in a supply pipe or a nozzle installed in the substrate processing apparatus, and the FNO gas generated in the supply pipe or the nozzle may be supplied into the process chamber 201. Further, for example, the FNO gas may be generated by installing a gas mixing chamber in the substrate processing apparatus and mixing the $F_2$ gas and the NO gas in the gas mixing chamber, and the FNO gas generated in the gas mixing chamber may be supplied into the process chamber 201 via the supply pipe or the nozzle.

Examples of the inert gas used in step A may include, in addition to nitrogen ($N_2$) gas, rare gases such as argon (Ar) gas, helium (He) gas, neon (Ne) gas, and xenon (Xe) gas. As the inert gas, the same one can be used in each step to be described later.

After the formation of the modified layer 200b on the surface of the base 200a is completed, the valve 116 is closed to stop the supply of the first gas into the process chamber 201. By doing this, step A is completed.

[Step B: First Purging Step]

After step A, step B is performed. In step B, the inside of the process chamber 201 is vacuum-exhausted to remove a gas and the like remaining in the process chamber 201 from the inside of the process chamber 201. At this time, the valve 136 may be opened to allow an inert gas to be supplied into the process chamber 201. The inert gas acts as a purge gas to purge the inside of the process chamber 201 (purging). In the present disclosure, the purge performed after step A is referred to as a first purge. The purge with the inert gas may not be performed. If the purge is not performed, exhaust of an atmosphere inside the process chamber 201 is performed. The purge removes the first gas 10 and the like that are not adsorbed on the wafer 200 and leaves the modified layer 200b on the surface of the base 200a. That is, a first purging step means at least one of the exhaust of the inside of the process chamber 201 and the pushing-out (purge) of the atmosphere inside the process chamber 201 by the supply of the inert gas into the process chamber 201. By performing both the exhaust and the purge, the exhaust efficiency of the atmosphere inside the process chamber 201 can be improved.

The valve 136 is opened to allow a first inert gas to flow into the gas supply pipe 133a. The flow rate of the first inert gas is adjusted by the MFC 135, and the first inert gas is supplied into the process chamber 201, flows over the surface of the wafer 200, and is exhausted through the exhaust port 221. The first inert gas is a normal temperature gas.

The process conditions for step B are exemplified as follows.

Processing temperature: 25 to 400 degrees C., specifically 50 to 250 degrees C.

Processing pressure: 1 to 13,300 Pa, specifically 50 to 1,330 Pa

Inert gas supply flow rate (for each gas supply pipe): 100 to 5,000 sccm, specifically 500 to 3,000 sccm Inert gas supply time: 1 to 600 seconds, specifically 10 to 120 seconds First inert gas temperature: normal temperature (room temperature)

[Step C: Second Gas Supply (Etching Gas Supply)]

After step B is completed, step C is performed. In step C, a second gas is supplied to the wafer 200 in the process chamber 201, that is, the wafer 200 having the modified layer 200b formed on the surface of the base 200a. As described above, the second gas is a gas having a molecular structure different from that of the first gas.

Specifically, the valve 126 is opened to allow the second gas to flow into the gas supply pipe 123a. The flow rate of the second gas is adjusted by the MFC 125, and the second gas is supplied into the process chamber 201, flows over the surface of the wafer 200, and is exhausted through the exhaust port 221. In this operation, the second gas is supplied to the wafer 200. Further, at this time, the valve 136 may be opened to allow an inert gas to be supplied into the process chamber 201.

Figure 5B:
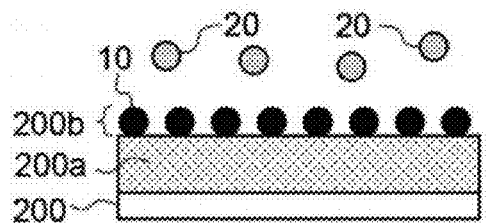
Figure 5C:
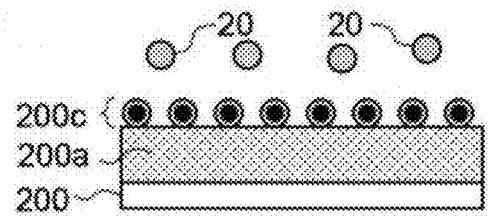

By supplying the second gas to the wafer 200 under the conditions to be described later, etching species are generated from the modified layer 200b formed on the surface of the base 200a. Specifically, as shown in FIG. 5B, when the second gas 20 is supplied to the wafer 200 having the modified layer 200b formed on the surface of the base 200a, as shown in FIG. 5C, the second gas 20 activates the modified layer 200b (here, the first gas 10 adsorbed on the surface of the base 200a) to generate the etching species 200c.

The etching species 200c are generated by at least one selected from causing reaction between the second gas and the modified layer 200b and activating the modified layer 200b with the second gas. The former generation of etching species 200c is hereinafter also referred to as etching species generation by reaction. The latter generation of etching species 200c is hereinafter also referred to as etching species generation by activation. That is, in this step, the etching species 200c are generated on the surface of the base 200a by the etching species generation by reaction and/or the etching species generation by activation. Further, since the etching species 200c are generated based on the modified layer 200b formed in a layer structure and exist in a layer structure, the etching species 200c may also be referred to as a layer 200c containing etching species, an etching species-containing layer 200c, or simply an etching species layer 200c. FIG. 5C shows, as an example, the etching species 200c generated by activating the first gas 10 adsorbed on the surface of the base 200a with the second gas 20, that is, the layer 200c containing the etching species.

Figure 5D:
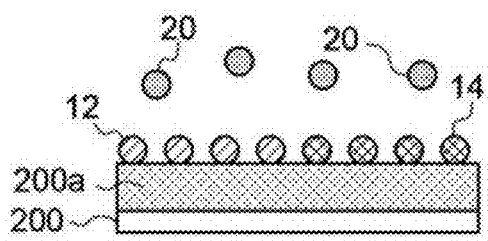

When the etching species 200c are generated on the surface of the base 200a, a portion of the surface of the base 200a is etched by the etching species 200c, as shown in FIG. 5D. When the portion of the surface of the base 200a is etched by the etching species 200c, for example, a first product 12, which is a by-product, is generated in the process of the etching reaction, as shown in FIG. 5D. At this time, in addition to the first product 12, a second product 14 may also be produced as a by-product. A case in which the first product 12 and the second product 14 are produced as by-products will be described below.

Figure 5E:
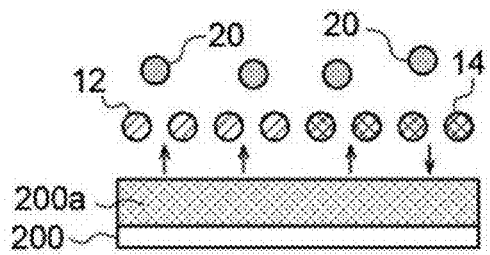
Figure 5F:
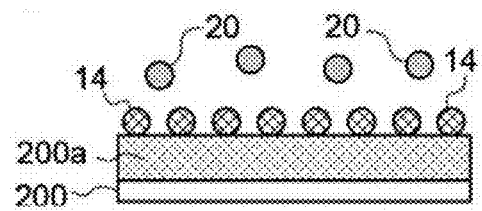
Figure 5G:
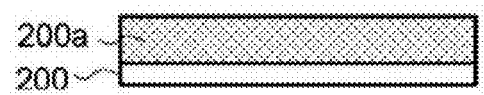

When the portion of the surface of the base 200*a* is etched by the etching species 200*c*, and when the first product 12 and the second product 14, which are by-products, are generated, the first product 12 is desorbed from the surface of the base 200*a*, for example, as shown in FIG. 5E. At this time, the second product 14 remains on the surface of the base 200*a*. Further, at this time, a portion of the second product 14 may be also desorbed from the surface of the base 200*a*. Further, at this time, the second product 14 may exhibit a behavior such as repeating the desorption from the surface of the base 200*a* and the adsorption on the surface of the base 200*a*. FIG. 5E shows, as an example, the desorption of the second product 14 from the surface of the base 200*a* and the adsorption of the second product 14 on the surface of the base 200*a*. After that, as shown in FIG. 5F, the second product 14 remains and/or adsorbs to the surface of the base 200*a* whose surface is partially etched.

In this way, when the second product 14 remains and/or adorbs to the surface of the base 200*a* whose surface is partially etched, foreign matters (particles) by the second product 14 are generated on the surface of the wafer 200 (the surface of the base 200*a*), and the particles adhere to the wafer 200. These particles have a problem of hindering the subsequent process performed on the wafer 200 from being performed on the surface of the wafer 200 (the surface of the base 200*a*). Here, the subsequent process means a process of (first gas→first purge→second gas→second purge)×n (where n≥2), or a process (for example, a film-forming process) performed after the etching process in the present disclosure, and the like.

In order to suppress the generation of particles on the wafer 200, in the present disclosure, step D (second purging step) of removing the first product 12 and the second product 14 is performed. The second purge process is a purging process performed after step C.

Specifically, step C may be performed at a lower pressure than the other steps (processes).

Examples of the second gas may include a halogen-containing gas, an acetylacetone-based gas, etc. Examples of the halogen-containing gas and the acetylacetone-based gas may include an I- and F-containing gas, a B- and Cl-containing gas, a Cl-containing gas, an H- and Cl-containing gas, an S-, O- and Cl-containing gas, an H- and F-containing gas, a metal- and F-containing gas, a metal- and Cl-containing gas, a Cl- and F-containing gas, an F-containing gas, an N- and F-containing gas, an N-, F- and O-containing gas, an N-, Cl- and O-containing gas, a C-, H- and O-containing gas, a C-, H-, F- and O-containing gas, etc.

Examples of these gases may include iodine heptafluoride ($IF_7$) gas, iodine pentafluoride ($IF_5$) gas, boron trichloride ($BCl_3$) gas, chlorine ($Cl_2$) gas, hydrogen chloride (HCl) gas, thionyl chloride ($SOCl_2$) gas, hydrogen fluoride (HF) gas, tungsten hexafluoride ($WF_6$) gas, tungsten hexachloride ($WCl_6$) gas, tungsten pentachloride ($WCl_5$) gas, chlorine monofluoride (ClF) gas, chlorine trifluoride ($ClF_3$) gas, fluorine ($F_2$) gas, nitrogen trifluoride ($NF_3$) gas, nitrosyl fluoride (FNO) gas, nitrosyl trifluoride ($F_3NO$) gas, nitroyl fluoride ($FNO_2$) gas, nitrosyl chloride (ClNO) gas, acetylacetone ($C_5H_8O_2$) gas, hexafluoroacetylacetone ($C_5H_2F_6O_2$) gas, etc. One or more of these gases can be used as the second gas.

As described above, a gas such as an FNO gas which is difficult to store may be generated, for example, by mixing $F_2$ gas and NO gas in a supply pipe or a nozzle installed in the substrate processing apparatus, and the FNO gas generated in the supply pipe or the nozzle may be supplied into the process chamber 201. Further, for example, the FNO gas may be generated by installing a gas mixing chamber in the substrate processing apparatus and mixing the $F_2$ gas and the NO gas in the gas mixing chamber, and the FNO gas generated in the gas mixing chamber may be supplied into the process chamber 201 via the supply pipe or the nozzle.

[Step D: Second Purging Step]

After the valve 126 is closed to stop the supply of the second gas, the valve 146 is opened to allow a second inert gas to be supplied into the process chamber 201 to remove the first product 12 or the second product 14 existing in the process chamber 201. Here, step D includes a step of heating the second inert gas to a first temperature by the gas heater 140. The second inert gas is heated to the first temperature by the gas heater 140, and the second inert gas heated to the first temperature is supplied to the wafer 200, so that the second product 14 adsorbed on the surface of the wafer 200 (the surface of the base 200*a*) can be heated to promote volatilization (desorption). That is, by supplying the heated second inert gas, generation of particles caused by the second product 14 can be suppressed. Further, since the inner wall of the process chamber 201 can also be heated, the adsorption of the first product 12 and the second product 14 on the inner wall of the process chamber 201 can be suppressed, thereby improving the efficiency of discharging the first product 12 and the second product 14 from the inside of the process chamber 201. Therefore, the particles generated near the inner wall of the process chamber 201 can be well suppressed. The temperature (first temperature) of the second inert gas is at least higher than the processing temperature of step C. In step D, the valve 136 may be either opened or closed. By keeping the valve 136 closed, dilution of the heated second inert gas can be suppressed. By suppressing the dilution of the second inert gas, the heating efficiency of by-products can be improved. On the other hand, by keeping the valve 136 opened, the flow rate of the inert gas can be increased. By increasing the flow rate of the inert gas, the removal of by-products from the wafer 200 and the process chamber 201 can be promoted. Further, in step D, both a period during which the valve 136 is closed and a period during which the valve 136 is opened may be provided. Further, by setting a second temperature of the second inert gas to be higher than the processing temperature of step A, the remaining first gas can be volatilized and removed from the wafer 200 and the process chamber 201.

The process conditions for step D are exemplified as follows.

Processing temperature: 25 to 400 degrees C., specifically 50 to 250 degrees C.

Processing pressure: 1 to 13,300 Pa, specifically 50 to 1,330 Pa

Inert gas supply flow rate (for each gas supply pipe): 100 to 5,000 sccm, specifically 500 to 3,000 sccm Inert gas supply time: 1 to 600 seconds, specifically 10 to 120 seconds Second inert gas heating temperature: 200 to 600 degrees C., specifically 200 to 400 degrees C.

The heating temperature of the second inert gas means a control temperature (set temperature) of the gas heater 140. When the temperature of the second inert gas can be measured, the temperature of the second inert gas may be controlled to be this control temperature. By supplying the second inert gas having such a temperature to the wafer 200, the temperature of the modified layer 200b (the surface of the wafer 200) is raised.

Specifically, step D may be performed at a higher pressure than the other steps (processes). More specifically, before starting step D, the internal pressure of the process chamber 201 may set to be lower than that of other steps (processes).

After step D, step E, which will be described later, may be performed.

[Performing Predetermined Number of Times]

By performing a cycle a predetermined number of times (n time, where n is an integer of 1 or more), the cycle including non-simultaneously, that is, without synchronization, performing the above-described steps A and C, it is possible to etch the base 200a exposed on the surface of the wafer 200 to a desired depth. The above cycle may be repeated a plurality of times. That is, the thickness of a layer formed per cycle may be set to be smaller than a desired thickness, and the above cycle may be repeated multiple times until the thickness of a layer removed by etching reaches the desired thickness.

(After-Purging and Pressure Adjustment)

After the etching process of the base 200a is completed, an inert gas as a purge gas is supplied from the gas supply pipe 133a into the process chamber 201 and is exhausted through the exhaust port 221. As a result, the inside of the process chamber 201 is purged to remove a gas and reaction by-products remaining in the process chamber 201 from the inside of the process chamber 201 (after-purging). After that, the internal atmosphere of the process chamber 201 is substituted with an inert gas (inert gas substitution) and the internal pressure of the process chamber 201 is returned to a predetermined pressure.

(Substrate Unloading Step)

The substrate mounting table 212 is lowered to the transfer position by the elevator 218 and the lift pins 207 protrude from the through-holes 214 toward the upper surface of the substrate support 210. Further, the gate valve 1490 is opened to transfer the wafer 200 from the lift pins 207 to the outside of the gate valve 1490.

(3) Effects of the Present Embodiment

According to the present embodiment, one or more effects set forth below may be achieved.

(A) By supplying the heated inert gas after supplying the second gas, the by-products such as the first product 12 and the second product 14 existing on the wafer 200 can be heated. Heating the by-products such as the first product 12 and the second product 14 facilitates volatilization of these by-products. By desorbing these by-products from the wafer 200, generation of particles caused by the by-products can be suppressed.

(B) By setting the temperature of the second inert gas to be higher than the processing temperature during the supply of the second gas, among by-products, in particular, the removal efficiency of the second product 14 which tends to remain on the wafer 200 may be improved. By setting the temperature of the second inert gas to be higher than the processing temperature during the supply of the second gas, the second product 14 existing on the wafer 200 can be heated, so that the volatilization of the second product 14 can be promoted.

(C) By separately providing the gas supply pipe for supplying the first inert gas and the gas supply pipe for supplying the second inert gas, the temperature drop of the second inert gas can be suppressed until the second inert gas flows from the gas heater 140 to the process chamber 201. Further, the temperature rise can be suppressed while the first inert gas flows to the process chamber 201. Further, when performing the cycle process, the temperature regulation time of each gas when supplying the first inert gas and the second inert gas can be shortened. That is, a substrate processing throughput and substrate processing quality can be improved.

(D) Before step A, by keeping the inside of the process chamber 201 in a depressurized state and performing step A with the inside of the process chamber 201 in the depressurized state, the first gas can be supplied to everywhere of the wafer 200. That is, the first gas can be supplied uniformly in the plane of the surface of the wafer 200 (the base 200a), so that the process uniformity in the plane of the surface of the wafer 200 can be improved. In particular, when a concave portion is formed on the surface of the wafer 200, the first gas can be uniformly supplied to the concave portion as well. Further, the first gas can be uniformly supplied to each of a plurality of concave portions.

(E) By performing step C at a pressure lower than the pressure inside the process chamber 201 of other steps (processes), the second gas can be supplied to everywhere of the modified layer. In particular, when a film to be etched exists in a concave portion, the second gas can be supplied to everywhere of the concave portion. In particular, the second gas can be supplied to the bottom surface side of the concave portion.

(F) By performing step D at a pressure higher than the pressure inside the process chamber 201 of other steps (processes), the heating rate of by-products existing on the surface of the wafer 200 can be improved, so that the removal efficiency of by-products can be improved.

(G) Before the start of step D, by setting the pressure inside the process chamber 201 to be lower than the pressure inside the process chamber 201 in other steps (processes), the second inert gas can be supplied uniformly in the plane of the wafer 200. That is, the in-plane of the wafer 200 can be uniformly heated. In particular, when the concave portion exists on the surface of the wafer 200, the inside of the concave portion or a plurality of concave portions can be uniformly heated. In particular, the bottom surface side of the concave portion can be heated uniformly.

Other Embodiments of the Present Disclosure

The embodiment of the present disclosure has been specifically described above. However, the present disclosure is not limited to the above-described embodiment, and various changes can be made without departing from the gist thereof.

For example, as in a processing sequence shown below, a third purging step (step E) may be performed after the second purging step. As a result, for example, it is possible to promote the formation of the modified layer 200b on the surface of the base 200a exposed on the surface of the wafer 200.

(First gas→First purge→Second gas→Second purge→Third purge)×$n$

[Step E: Third Purging Step]

In step E, the inside of the process chamber 201 is vacuum-exhausted to remove a gas and the like remaining in the process chamber 201 from the inside of the process chamber 201. That is, the atmosphere inside the process chamber 201 is exhausted to lower the pressure inside the process chamber 201. At this time, the surface of the wafer 200 (the surface of the base 200a) is in a state of being heated in step D (a state in which the temperature is raised). By reducing the pressure inside the process chamber 201 in the state in which the temperature of the surface of the wafer 200 is raised in this way, the volatilization of by-products existing on the surface of the wafer 200 can be promoted.

Further, in step E, the valve 136 may be opened to allow the first inert gas to be supplied to the process chamber 201 (the wafer 200). By supplying the first inert gas having the second temperature lower than the first temperature to the wafer 200, at least the temperature of the surface of the wafer 200 (the surface of the base 200a) can be regulated to a temperature suitable for processing of the next process (step A). For example, if the processing temperature in step A is lower than the processing temperature in step D, the surface of the wafer 200 is cooled by supplying the first inert gas in step E to make the temperature of the wafer 200 close to (or approach) the processing temperature in step A. By bringing the temperature of the wafer 200 close to the processing temperature of step A, a predetermined amount of reaction between the first gas (modifying gas) and the base 200a can be obtained in step A to be performed next. If the reaction between the first gas and the base 200a occurs in a self-limiting manner, in step E, by bringing the temperature of the wafer 200 close to the processing temperature in step A, it is possible to suppress a decrease in the self-limiting effect obtained in step A to be performed next to step E. By obtaining the self-limiting effect, it is possible to improve the process uniformity in the plane of the wafer 200 (in the plane of the base 200a).

Here, the conditions for supplying the first inert gas are, for example, the same conditions as in the above-described step B. That is, the second temperature is the normal temperature (room temperature). When the gas supply pipe 150 is heated in step D, the second temperature may be higher than the room temperature.

Further, in step E, the inside of the process chamber 201 may be exhausted before the supply of the first inert gas. That is, the supply of the first inert gas in step E is performed after the inside of the process chamber 201 is exhausted. By exhausting the process chamber 201 before the supply of the first inert gas, the pressure inside the process chamber 201 can be lowered while maintaining the surface of the wafer 200 (the surface of the base 200a) at the second temperature, so that the above-described effects can be obtained.

Further, in step E, after the supply of the first inert gas, the inside of the process chamber 201 may be exhausted again to remove a gas and the like remaining in the process chamber 201 from the inside of the process chamber 201. Here, the exhaust of the process chamber 201 may set the pressure inside the process chamber 201 to be lower than the pressure inside the process chamber 201 in step A. By lowering the pressure inside the process chamber 201 in step A, the same effects as the above-described effects (D) can be obtained.

Further, in step E, at least one selected from the above-described exhaust of the process chamber 201 and the above-described supply of the first inert gas into the process chamber 201 is performed.

[Another Embodiment of Step C: Activation of Second Gas]

In the above-described step C, at least one of the RPU 124 and the high frequency power source 252 may be turned on to activate the second gas. By supplying the activated second gas to the wafer 200, the removal efficiency of the modified layer 200b can be improved. Further, it is possible to etch not only the modified layer 200b but also the surface side of the base 200a. Therefore, even if the modified layer 200b is not uniformly formed on the surface of the base 200a by the first gas, it is possible to etch the base 200a. Such an effect can be remarkably obtained particularly by using the high frequency power source 252 to generate plasma of the second gas in the process chamber 201. This is also simply referred to as exciting the second gas. By generating the plasma of the second gas in the process chamber 201, the high energy second gas (ions of the second gas) can be supplied to the surface of the wafer 200, so that the surfaces of the modified layer 200b and the base 200a can be removed in a sputtering manner. In order to enhance such a sputtering effect, the above-mentioned rare gas may be used as the second gas, or the above-mentioned rare gas may be added to the above second gas. By using the rare gas, ions that are easily supplied to the surface of the wafer 200 can be generated.

[Another Embodiment of Step D: Heating of Surface of Wafer 200]

Figure 6:
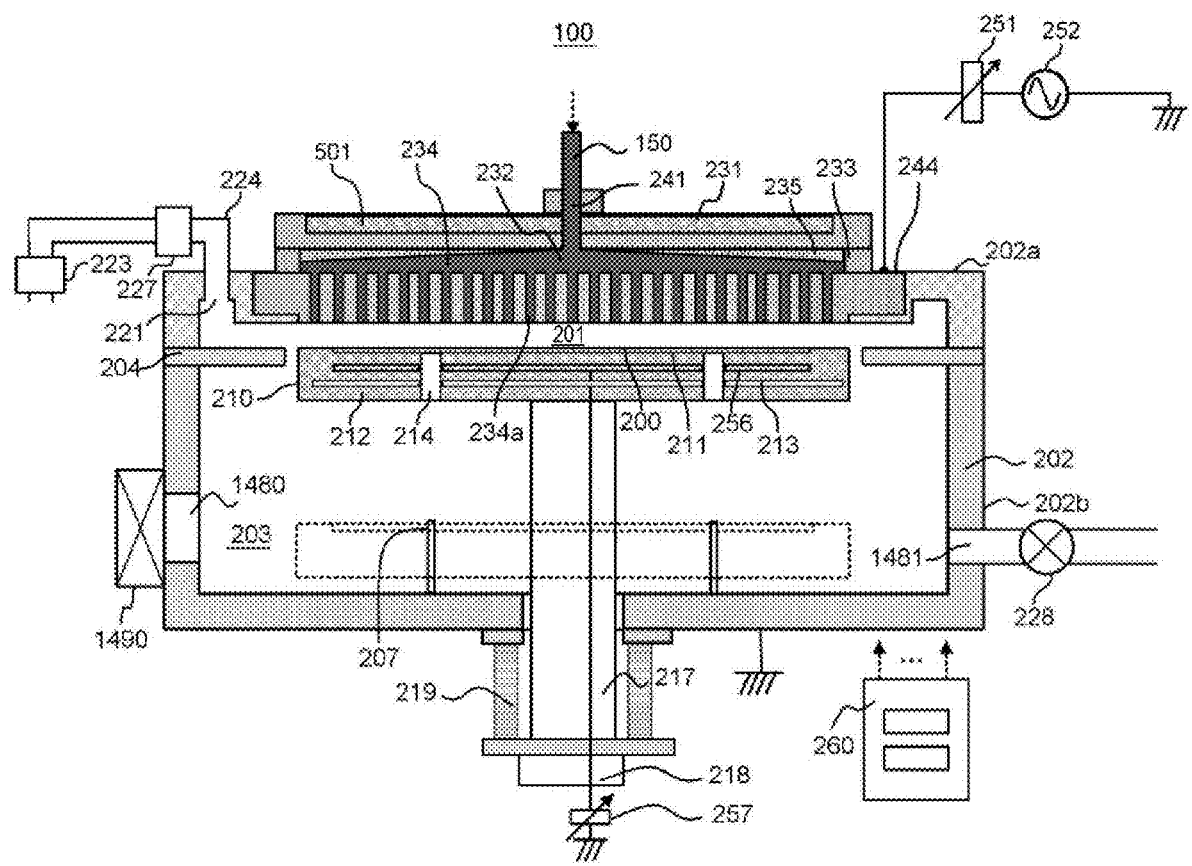
FIG. 6 is a schematic configuration view of a substrate processing apparatus according to another embodiment of the present disclosure.

In the above example, the second inert gas is used to heat the surface of the wafer 200 (the surface of the base 200a), but a method of heating the surface of the wafer 200 is not limited thereto. For example, as shown in FIG. 6, a lamp 501 may be installed in the substrate processing apparatus 100 and the surface of the wafer 200 may be heated using the lamp 501. When the substrate processing apparatus 100 is installed with the lamp 501 as shown in FIG. 6, a member existing above the wafer 200 is made of a material that transmits light so that the surface of the wafer 200 is irradiated with the light of the lamp 501. Here, the member existing above the wafer 200 is, for example, the shower head 234. Such a light-transmitting material includes, for example, quartz ($SiO_2$) glass and sapphire glass. In a part of step D, by turning on the lamp 501 to heat the surface of the wafer 200, the same effects as described above can be obtained. Further, the temperature of the surface of the wafer 200 can be heated to a predetermined temperature in a short time as compared to the heating using the second gas described above.

[Regarding Film to be Processed (Etched)]

The base 200a as a film to be etched may be at least one selected from the group of a silicon nitride film (SiN film), a silicon carbonitride film (SiCN film), a nitrogen-rich silicon oxynitride film (SiON film), a nitrogen-rich silicon oxycarbonitride film (SiOCN film), a silicon boronitride film (SiBN film), a silicon borocarbonitride film (SiBCN film), a boron nitride film (BN film), a titanium nitride film (TiN film), a tungsten nitride film (WN film), a tungsten film (W film), a molybdenum film (Mo film), a silicon film (Si film), a germanium film (Ge film), and a silicon germanium film (SiGe film).

The O-containing film such as the SiON film or the SiOCN film as a film may be an N-rich film, that is, a film in which the N concentration in the film is higher than the O concentration in the film. That is, the SiON film and the SiOCN film may be N-rich SiON films and N-rich SiOCN films, respectively. Even if the film contains O in addition to N, when the N concentration is higher than the O concentration, it is possible to sufficiently etch the film by the method of thee above-described embodiment.

In this way, the base 200a as a film may be silicon-based nitride films (silicon-based nitrogen-containing films) such as the SiN film, the SiCN film, the N-rich SiON film, the N-rich SiOCN film, the SiBN film, and the SiBCN film, boron-based nitride films (boron-based nitrogen-containing films) such as the BN film, nitrogen-containing films such as metal-based nitride films (metal-based nitrogen-containing films) of the TiN film and the WN film, metal films (transition metal films, single transition metal films) such as the W film and the Mo film, semiconductor films such as the Si film, the Ge film, and the SiGe film, etc.

Even when the base 200a as a film is at least one selected from the group of these films, the same effects as the above embodiment can be obtained.

[Regarding Recipe]

Recipes used in each process may be prepared individually according to the processing contents and may be stored in the memory 260c via a telecommunication line or the external memory 262. Moreover, at the beginning of each process, the CPU 260a may properly select an appropriate recipe from the recipes stored in the memory 260c according to the processing contents. Thus, it is possible for a single substrate processing apparatus to realize various etching processes with good reproducibility. Further, it is possible to reduce an operator's burden and to quickly start each process while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 261 of the existing substrate processing apparatus.

[Regarding Purging]

The purging in the present disclosure may be configured to perform at least one selected from the exhaust of the inside of the process chamber 201 and the supply of the inert gas into the process chamber 201.

[Regarding Substrate Processing Apparatus]

Although the apparatus configuration for processing one substrate in one process chamber has been described above, the present disclosure is not limited thereto. For example, the apparatus may be an apparatus in which a plurality of substrates are arranged horizontally or vertically.

Even in the case of using such a substrate processing apparatus, each process may be performed according to the same processing procedures and process conditions as those in the above-described embodiments, and the same effects as the above-described embodiments are achieved.

The above-described embodiments may be used in proper combination. The processing procedures and process conditions used in this case may be the same as, for example, the processing procedures and process conditions in the above-described embodiments.

According to the present disclosure in some embodiments, it is possible to suppress deterioration in the quality of the film by reducing the amount of foreign matters generated in the etching process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A method of processing a substrate, comprising:
   a) supplying a first gas to the substrate on which a film is formed and forming a modified layer on a surface of the film;
   b) after a), supplying a second gas to the modified layer and removing the modified layer;
   c) after b), supplying an inert gas having a first temperature higher than a processing temperature of b) to the film;
   d) after c), supplying an inert gas having a second temperature that is lower than the first temperature to the film; and
   e) removing a portion of the film by performing a), b), c) and (d) sequentially a predetermined number of times.

2. The method of claim 1, further comprising: f) before c), heating the inert gas to the first temperature.

3. The method of claim 1, wherein in d), a temperature of the substrate is brought close to the processing temperature when performing a) for the first time in d).

4. The method of claim 1, wherein a pressure of a space in which the substrate exists is lower when b) is performed than when a) and c) are performed, and
   wherein the pressure of the space in which the substrate exists is higher when c) is performed than when a) and b) are performed.

5. The method of claim 1, wherein in c), a temperature of the surface of the film is set to be higher than a temperature of the surface of the film in b).

6. The method of claim 1, further comprising: g) before c), exhausting a space in which the substrate exists.

7. The method of claim 1, further comprising: h) after c), exhausting a space in which the substrate exists.

8. The method of claim 1, wherein b) includes activating the second gas.

9. The method of claim 1, wherein in b), an excited rare gas as the second gas is supplied to the substrate.

10. The method of claim 1, wherein in c), the substrate is irradiated with a lamp.

11. A method of manufacturing a semiconductor device comprising the method of claim 1.

12. A non-transitory computer-readable recording medium storing a program that causes, by a computer, a substrate processing apparatus to perform a process comprising:
   a) supplying a first gas to a substrate on which a film is formed and forming a modified layer on a surface of the film;
   b) after a), supplying a second gas to the modified layer and removing the modified layer;
   c) after b), supplying an inert gas having a first temperature higher than a processing temperature of b) to the film;
   d) after c), supplying an inert gas having a second temperature that is lower than the first temperature to the film; and
   e) removing a portion of the film by performing a), b), c) and d) sequentially a predetermined number of times.

13. A substrate processing apparatus comprising:
   a process container configured to accommodate the substrate;
   a first gas supplier configured to supply the first gas into the process container;
   a second gas supplier configured to supply the second gas into the process container;
   a first inert gas supplier configured to supply the inert gas having the first temperature into the process container;

a second inert gas supplier configured to supply the inert gas having the second temperature into the process container; and a controller configured to control the first gas supplier, the second gas supplier, the first inert gas supplier, and the second inert gas supplier so as to perform the method of claim 1.

14. The method of claim 1, wherein after e) is performed, e) is performed again.

15. The method of claim 1, wherein in c), the inert gas is heated to the first temperature by a gas heater installed in a gas supplier.

16. The method of claim 15, wherein in d), the inert gas having the second temperature is supplied to a space in which the substrate exists, through a pipe, on which the gas heater is not installed.

17. The method of claim 15, wherein in c), a control temperature of the gas heater is set to be higher than a processing temperature of b).

18. The method of claim 1, wherein the film is formed in a concave portion on a surface of the substrate, and wherein in d), the inert gas having the second temperature is supplied to the film.

\* \* \* \* \*